(12) United States Patent
Yuasa et al.

(10) Patent No.: US 10,588,215 B2
(45) Date of Patent: Mar. 10, 2020

(54) INTER-BOARD CONNECTION STRUCTURE

(71) Applicant: Mitsubishi Electric Corporation, Tokyo (JP)

(72) Inventors: Takeshi Yuasa, Tokyo (JP); Takeshi Oshima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/490,449

(22) PCT Filed: Apr. 7, 2017

(86) PCT No.: PCT/JP2017/014538
§ 371 (c)(1),
(2) Date: Aug. 30, 2019

(87) PCT Pub. No.: WO2018/185935
PCT Pub. Date: Oct. 11, 2018

(65) Prior Publication Data
US 2020/0022249 A1   Jan. 16, 2020

(51) Int. Cl.
*H05K 1/02* (2006.01)
*H05K 1/11* (2006.01)
*H05K 1/18* (2006.01)

(52) U.S. Cl.
CPC .............. *H05K 1/025* (2013.01); *H05K 1/113* (2013.01); *H05K 1/181* (2013.01); *H05K 2201/09254* (2013.01); *H05K 2201/09281* (2013.01); *H05K 2201/09727* (2013.01); *H05K 2201/10734* (2013.01)

(58) Field of Classification Search
CPC ....... H05K 1/025; H05K 1/0251; H05K 1/144
See application file for complete search history.

(56) References Cited

FOREIGN PATENT DOCUMENTS

JP   2001-168236 A   6/2001
JP   4990021 B2   8/2012

OTHER PUBLICATIONS

Röhrl et al., "Wideband RF Interconnects for Organic Chip Packages", Proceedings of the 45th European Microwave Conference, 2015, pp. 781-784.

*Primary Examiner* — Jeremy C Norris
(74) *Attorney, Agent, or Firm* — Birch, Stewart, Kolasch & Birch, LLP.

(57) ABSTRACT

Disclosed is an inter-board connection structure including a signal line conductor (22) provided in an outer layer of a printed circuit board (100), a signal line conductor (24) extending in a direction from the signal line conductor (22) to a signal pad (21), and forming a capacitive component between itself and a signal pad (21), and a signal line conductor (23) branching and extending from a connecting portion between the signal line conductor (22) and the signal line conductor (24), and electrically connected to the signal pad (21).

5 Claims, 5 Drawing Sheets

INTER-BOARD CONNECTION STRUCTURE

TECHNICAL FIELD

The present disclosure relates to an inter-board connection structure that electrically connects electrode pads between boards by using solder bumps.

BACKGROUND ART

In modules of ball grid array (BGA) type, an inter-board connection structure that electrically connects electrode pads between boards by using solder bumps is adopted.

In a conventional inter-board connection structure, in order to reduce a parasitic capacitance component formed between a pad on a dielectric board, and a ground conductor located in an inner layer of the dielectric board, thereby improving the high frequency characteristics, a part of the ground conductor which is directly under the pad is removed to form a punched hole. However, because a punched hole of the ground conductor causes coupling with a wire located in the inner layer of the dielectric board, there is a case in which such a punched hole cannot be used for an inter-board connection structure.

For example, in Patent Literature 1, a structure for improving the high frequency characteristics without making punched holes of a ground conductor is described. In a structure described in Patent Literature 1 for connecting a substrate and a semiconductor element, the length of a plated stub and the shape of an external electrode pad are set in such a way that, in the substrate, the plated stub and the external electrode pad exhibit capacitivity within a desired frequency range.

Further, by limiting a conductor wire extending from the external electrode pad to a part connected to an electrode pad of the semiconductor element to within a range within which the electrical influence of the plated stub or the external electrode pad reaches, a line having uniform impedance is implemented.

CITATION LIST

Patent Literature

Patent Literature 1: JP 2001-168236 A

SUMMARY OF INVENTION

Technical Problem

However, in the conventional inter-board connection structure typified by Patent Literature 1, the size of a signal line conductor opposite to the ground conductor needs to be increased in a case in which a ground capacitance component needed for matching of impedance is tried to be provided. Therefore, a problem is that the size of the impedance matching circuit becomes larger.

The present disclosure is made in order to solve the above-mentioned problem, and it is therefore an object of the present disclosure to provide an inter-board connection structure that can downsize an impedance matching circuit.

Solution to Problem

An inter-board connection structure according to the present disclosure includes: a plate-shaped ground conductor provided in an inner layer of a first dielectric board; a first signal pad provided in an outer layer of the first dielectric board; a first ground pad provided in the outer layer of the first dielectric board and in an area surrounding the first signal pad; a columnar conductor electrically connecting the plate-shaped ground conductor and the first ground pad; a first signal line conductor provided in the outer layer or the inner layer of the first dielectric board; a second signal line conductor extending in a direction from the first signal line conductor to the first signal pad, and forming a capacitive component between the second signal line conductor and the first signal pad; a third signal line conductor branching and extending from a connecting portion between the first signal line conductor and the second signal line conductor, and electrically connected to the first signal pad; a second signal pad provided in an outer layer of a second dielectric board; a second ground pad provided in the outer layer of the second dielectric board and in an area surrounding the second signal pad; a signal bump electrically connecting the first signal pad and the second signal pad; and a ground bump electrically connecting the first ground pad and the second ground pad.

Advantageous Effects of Invention

According to the present disclosure, even though no punched hole is provided in the plate-shaped ground conductor located in the inner layer of the first dielectric board, and the third signal line conductor is made small in order to downsize an impedance matching circuit, capacitance needed for matching of impedance can be ensured by the capacitive component formed between the first signal pad and the second signal line conductor. As a result, the impedance matching circuit can be downsized.

DESCRIPTION OF EMBODIMENTS

Hereafter, in order to explain the present disclosure in greater detail, preferred embodiments of the present disclosure will be described with reference to the accompanying drawings.

Embodiment 1

Figure 1A:
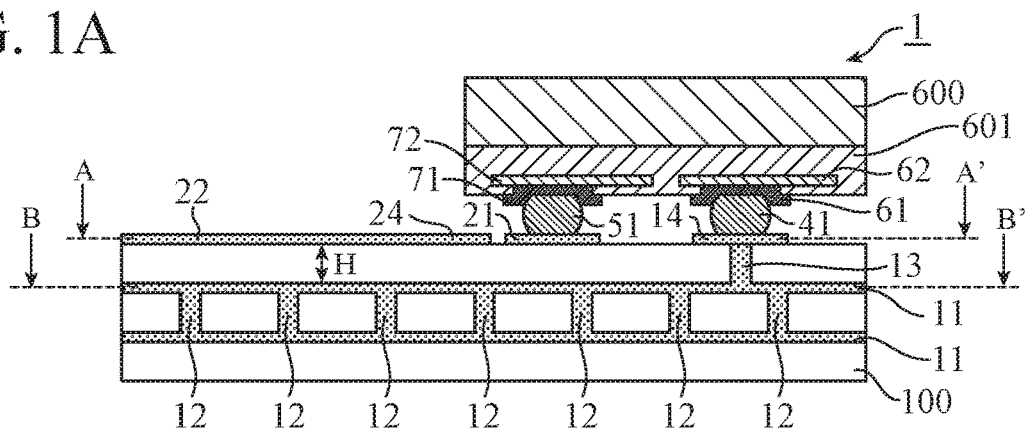
FIG. 1A is a cross-sectional view showing the configuration of a module including an inter-board connection structure according to Embodiment 1 of the present disclosure.
Figure 1B:
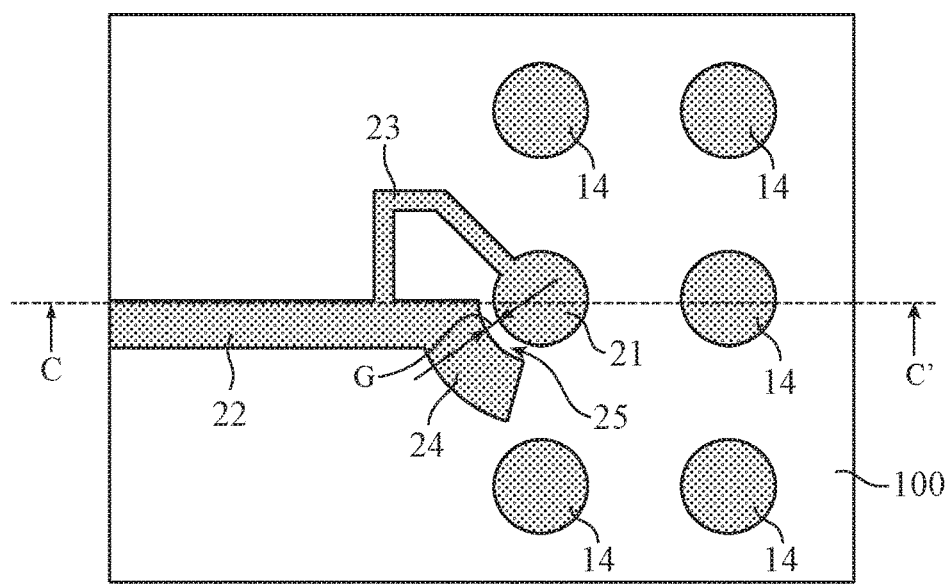
FIG. 1B is a cross-sectional view on arrow showing the module taken on the plane of the A-A' line of FIG. 1A, the module including the inter-board connection structure according to Embodiment 1.
Figure 1C:
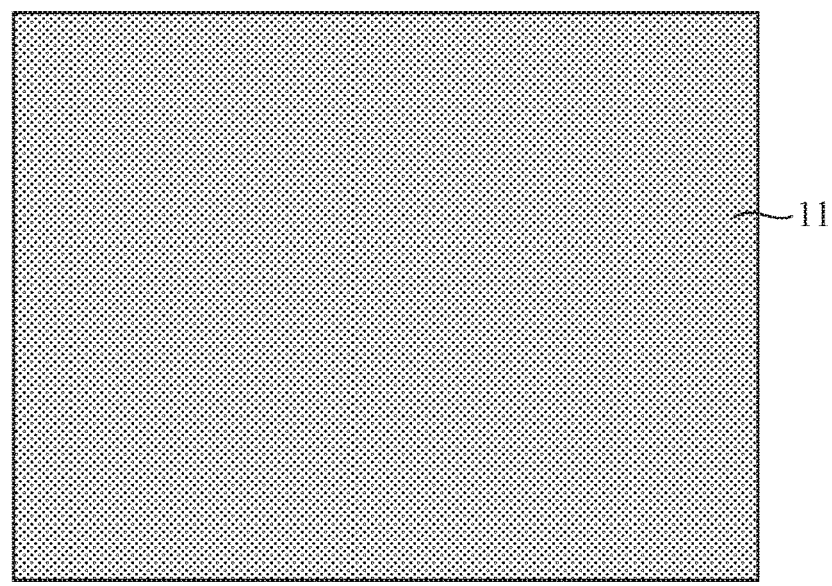
FIG. 1C is a cross-sectional view on arrow showing the module taken on the plane of the B-B' line of FIG. 1A, the module including the inter-board connection structure according to Embodiment 1.

FIG. 1A is a cross-sectional view showing the configuration of a module 1 provided with an inter-board connection structure according to Embodiment 1 of the present disclosure, and shows a view of the module 1 taken along the C-C' line of FIG. 1B. FIG. 1B is a cross-sectional view on arrow of the module 1 taken on the plane of the A-A' line of FIG. 1A. The A-A' line divides each of the following components: ground pads 14, a signal pad 21, a signal line conductor 22, a signal line conductor 23, and a signal line conductor 24 into two parts in a thickness direction. FIG. 1C is a cross-sectional view on arrow of the module 1 taken on the plane of the B-B' line of FIG. 1A. The B-B' line divides a plate-shaped ground conductor 11 into two parts in the thickness direction.

The module 1 includes a printed circuit board 100 and a semiconductor board 600, and electrode pads between the printed circuit board 100 and the semiconductor board 600 are electrically connected by the inter-board connection structure according to Embodiment 1.

The printed circuit board 100 is a first dielectric board in which one or multiple plate-shaped ground conductors 11 are provided in an inner layer. Each plate-shaped ground conductor 11 is a solid ground provided throughout in a corresponding plane in the inner layer of the printed circuit board 100, as shown in FIG. 1C.

For example, in FIG. 1A, two plate-shaped ground conductor layers 11 are provided in the inner layer of the printed circuit board 100. The two plate-shaped ground conductor layers 11 are electrically connected via multiple ground through holes 12 that are columnar conductors, and are held at the same electric potential. By providing the multiple plate-shaped ground conductors 11, the ground pads 14 can be grounded more surely.

On a front surface of the printed circuit board 100, the ground pads 14, the signal pad 21, the signal line conductor 22, the signal line conductor 23, and the signal line conductor 24 are provided. The ground pads 14 are first ground pads provided in an outer layer of the printed circuit board 100 and in an area surrounding the signal pad 21, as shown in FIG. 1B. Further, as shown in FIG. 1A, the ground pads 14 are electrically connected to the plate-shaped ground conductors 11 via ground through holes 13 that are columnar conductors, so that the ground pads have a grounding electric potential. The signal pad 21 is a first signal pad provided in the outer layer of the printed circuit board 100.

The signal line conductor 22 is a first signal line conductor provided in the outer layer of the printed circuit board 100, and one end of the signal line conductor 22 is connected to both the signal line conductor 23 and the signal line conductor 24.

Although in FIGS. 1A and 1B the signal line conductor 22 arranged in the outer layer of the printed circuit board 100 is shown, the signal line conductor 22 may be arranged in the inner layer of the printed circuit board 100.

The signal line conductor 23 is a third signal line conductor branching and extending from a connecting portion between the signal line conductor 22 and the signal line conductor 24, and electrically connected to the signal pad 21, as shown in FIG. 1B.

For example, in order to provide capacitance used for matching of impedance and downsize an impedance matching circuit, the signal line conductor 23 is constituted by a wire having a narrower wire width than those of the signal line conductor 22 and the signal line conductor 24, the wire being bent so as to take a long circuit and reach the signal pad 21.

By thus designing the signal line conductor 23 in such away that the signal line conductor has a smaller size, a ground capacitance component in the signal line conductor 23 is reduced.

The signal line conductor 24 is a second signal line conductor which extends in a direction from the signal line conductor 22 to the signal pad 21 and whose leading end is open, and forms a capacitive component between the signal line conductor 24 and the signal pad 21. For example, by causing the leading end of the signal line conductor 24 to extend close to the signal pad 21, so that the signal pad 21 and the signal line conductor 24 are opposite to each other, and thus a capacitive component corresponding to the spacing G is formed between the signal pad 21 and the signal line conductor 24. This portion is referred to as an inter-signal capacitance forming portion 25.

Further, the signal line conductor 24 may be configured so as to further extend along the periphery of the signal pad 21, as shown in FIG. 1B. In this configuration, because a portion where the signal pad 21 and the signal line conductor 24 are close to each other, i.e., the inter-signal capacitance forming portion 25 is long, the capacitive component formed in the inter-signal capacitance forming portion 25 increases.

In a case in which the spacing G is made shorter than the distance H between the plate-shaped ground conductor 11 and the signal line conductor 24 in FIG. 1A, the capacitive component formed in the inter-signal capacitance forming portion 25 increases.

In the inter-board connection structure according to Embodiment 1, even though the signal line conductor 23 is made smaller, so that the ground capacitance component thereof is reduced, capacitance needed for matching of impedance is ensured by both the capacitive component formed in the inter-signal capacitance forming portion 25 and the ground capacitance component in the signal line conductor 24.

The semiconductor board 600 is a second dielectric board in which ground pads 61 and a signal pad 71 are provided on a rear surface. A wiring layer 601 is provided in an inner layer of the semiconductor board 600, and at least one ground conductor 62 and a signal line conductor 72 are provided in the wiring layer 601.

The ground pads 61 are second ground pads provided in an outer layer of the semiconductor board 600, and are electrically connected to the ground conductor 62 provided in the inner layer of the semiconductor board 600.

The signal pad 71 is a second signal pad provided in the outer layer of the semiconductor board 600, and is electrically connected to the signal line conductor 72 provided in the inner layer of the semiconductor board 600.

After the printed circuit board 100 and the semiconductor board 600 are arranged in such a way that the front surface of the printed circuit board 100 and the rear surface of the semiconductor board 600 are opposite to each other, the ground pads 14 and the ground pads 61 are electrically connected by ground bumps 41 and the signal pad 21 and the signal pad 71 are electrically connected by a signal bump 51.

The ground bumps 41 and the signal bump 51 are solder bumps, and the electrode pads are electrically connected by, for example, melting and solidifying solder.

As shown in FIG. 1C, in the inter-board connection structure according to Embodiment 1, no punched holes are provided in the plate-shaped ground conductors 11. For this reason, even if the upper circuit and the lower circuit that border each other along the plane of the B-B' line shown in FIG. 1A are separated from each other, there is no change in the functions of the upper circuit.

Next, the influence of the presence or absence of the inter-signal capacitance forming portion 25 on the size of the impedance matching circuit will be explained.

Figure 2A:
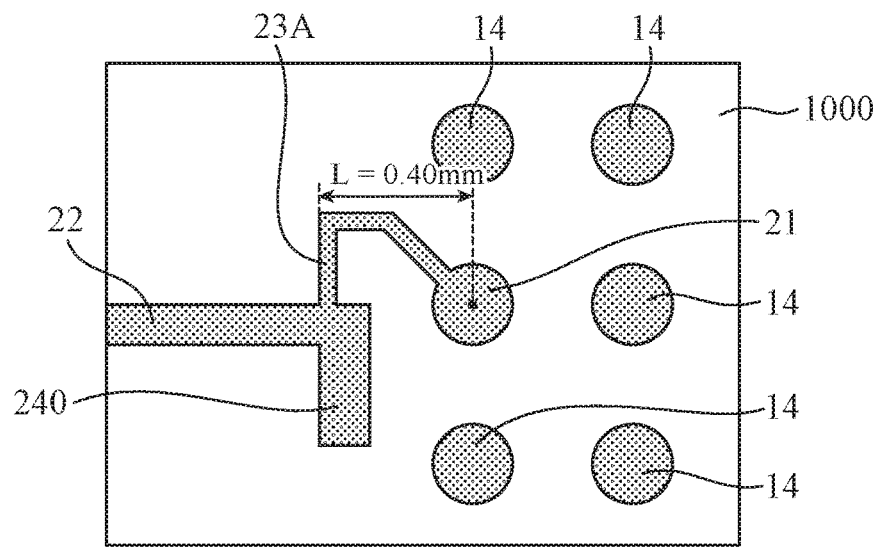
FIG. 2A is a diagram showing a conductor pattern in an outer layer of a printed circuit board not having an inter-signal capacitance forming portion.
Figure 2B:
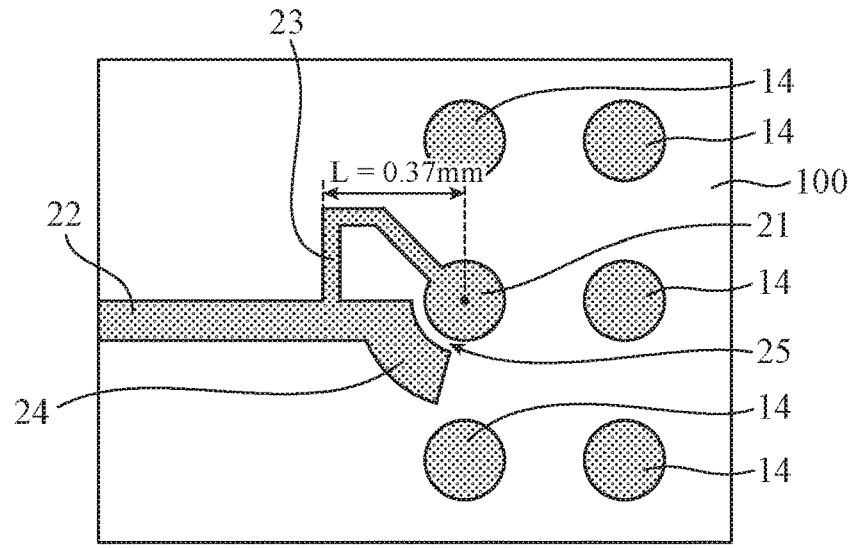
FIG. 2B is a diagram showing a conductor pattern in an outer layer of a printed circuit board having an inter-signal capacitance forming portion.
Figure 2C:
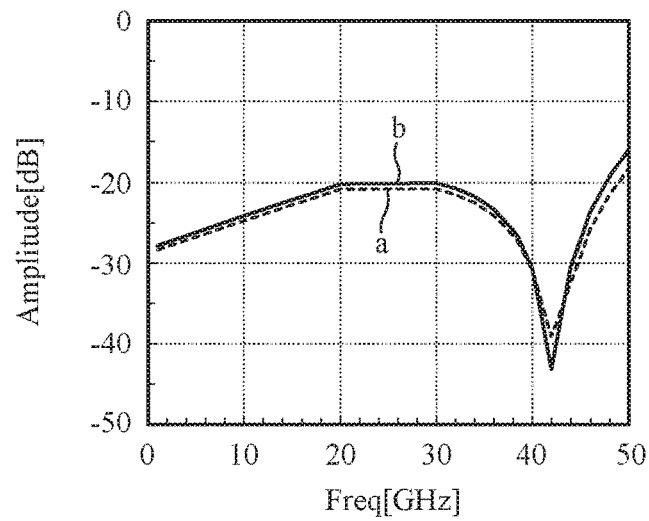
FIG. 2C is a graph showing results of electromagnetic field simulation of reflection characteristics in both an inter-board connection structure having the printed circuit board of FIG. 2A, and an inter-board connection structure having the printed circuit board of FIG. 2B.

FIG. 2A is a figure showing a conductor pattern in an outer layer of a printed circuit board 1000 not having the inter-signal capacitance forming portion 25. FIG. 2B is a figure showing the conductor pattern in the outer layer of the printed circuit board 100 having the inter-signal capacitance forming portion 25. FIG. 2C is a graph showing results of electromagnetic field simulation of reflection characteristics in both an inter-board connection structure having the printed circuit board 1000 of FIG. 2A, and an inter-board connection structure having the printed circuit board 100 of FIG. 2B. A three-dimensional electromagnetic field analysis tool is used for the electromagnetic field simulation.

A signal line conductor 240 in the printed circuit board 1000 extends from a signal line conductor 22, and is provided instead of the signal line conductor 24 in the printed circuit board 100. The signal line conductor 240 extends toward a direction away from a signal pad 21, unlike the signal line conductor 24, and thus no inter-signal capacitance forming portion 25 is formed in the printed circuit board 1000.

In FIG. 2C, the simulation is performed while the relative dielectric constant of each of the printed circuit boards 100 and 1000 is set to 3.3, the relative dielectric constant of the wiring layer 601 is set to 3.5, and the characteristic impedance is set to 50Ω. Further, both the inter-board connection structure having the printed circuit board 1000 and the inter-board connection structure having the printed circuit board 100 are designed so as to have a matching point at the same frequency (approximately 42 GHz). As a result, the reflection characteristic curve a of the inter-board connection structure having the printed circuit board 1000 and the reflection characteristic curve b of the inter-board connection structure having the printed circuit board 100 are nearly the same as each other, and both the reflection characteristic curves have the same performance.

In a case in which the inter-board connection structure not having the inter-signal capacitance forming portion 25 and the inter-board connection structure having the inter-signal capacitance forming portion 25 are configured in such a way that their reflection characteristics have the same performance, there appears a remarkable difference between the lengths L in a rightward or leftward direction on the page of the signal line conductors 23 and 23A, as shown in FIGS. 2A and 2B.

Although the length of the signal line conductor 23A of the inter-board connection structure not having the inter-signal capacitance forming portion 25 is L=0.40 mm, as shown in FIG. 2A, the length of the signal line conductor 23 of the inter-board connection structure having the inter-signal capacitance forming portion 25 is L=0.37 mm, as shown in FIG. 2B.

More specifically, the inter-signal capacitance forming portion 25 is effective for downsizing of the impedance matching circuit.

Although in FIG. 1A the inter-board connection structure between the printed circuit board 100 and the semiconductor board 600 is shown, another type of board may be used as long as it is possible to electrically connect the electrode pads between the boards by using solder bumps. For example, a printed circuit board may be used instead of the semiconductor board 600, or a ceramic board or the like may be used.

Although in FIG. 1B the case in which each of the multiple ground pads 14 is independently provided in the outer layer of the printed circuit board 100 is shown, the multiple ground pads 14 may be electrically connected to each other in the outer layer of the printed circuit board 100. In this case, the ground pads are formed in an opening of a solder resist.

As mentioned above, in the inter-board connection structure according to Embodiment 1, even though no punched holes are provided in the plate-shaped ground conductors 11 located in the inner layer of the printed circuit board 100, and the signal line conductor 23 is made smaller in order to downsize the impedance matching circuit, capacitance needed for matching of impedance can be ensured by both the capacitive component formed in the inter-signal capacitance forming portion 25 and the earth capacitance component in the signal line conductor 24. As a result, the impedance matching circuit can be downsized.

Further, by configuring the signal line conductor 24 with a wire extending along the periphery of the signal pad 21, the inter-signal capacitance forming portion 25 is lengthened, and thus it becomes easy to provide a capacitance value.

Embodiment 2

Figure 3A:
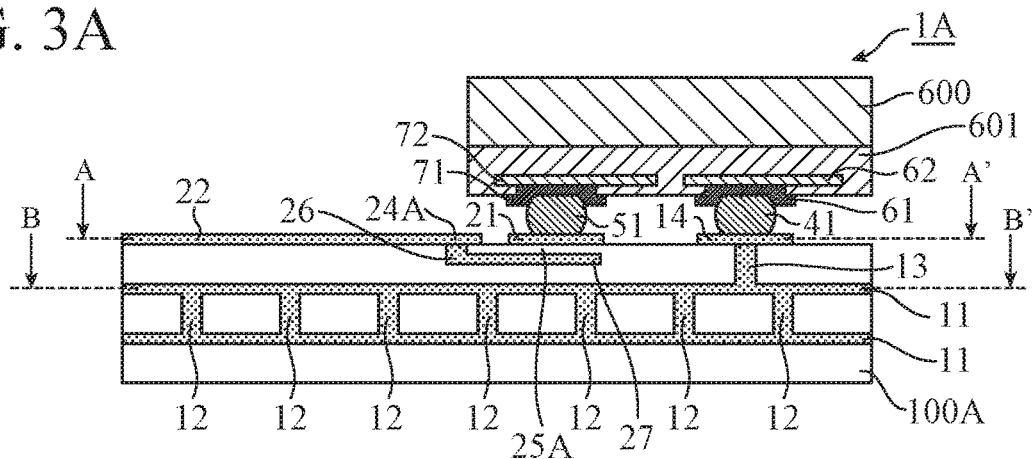
FIG. 3A is a cross-sectional view showing the configuration of a module including an inter-board connection structure according to Embodiment 2 of the present disclosure.
Figure 3B:
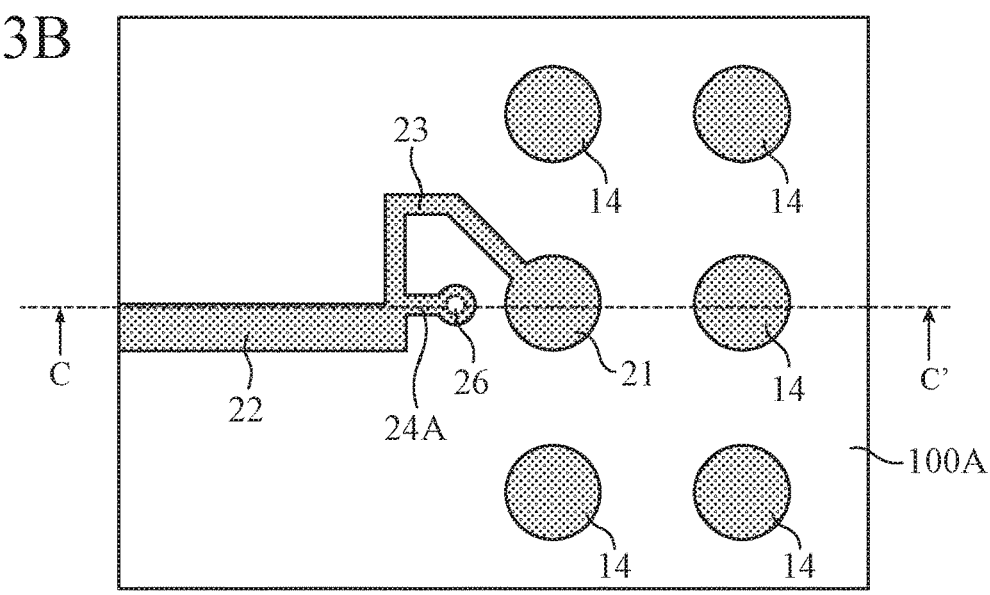
FIG. 3B is a cross-sectional view on arrow showing the module taken on the plane of the A-A' line of FIG. 3A, the module including the inter-board connection structure according to Embodiment 2.
Figure 3C:
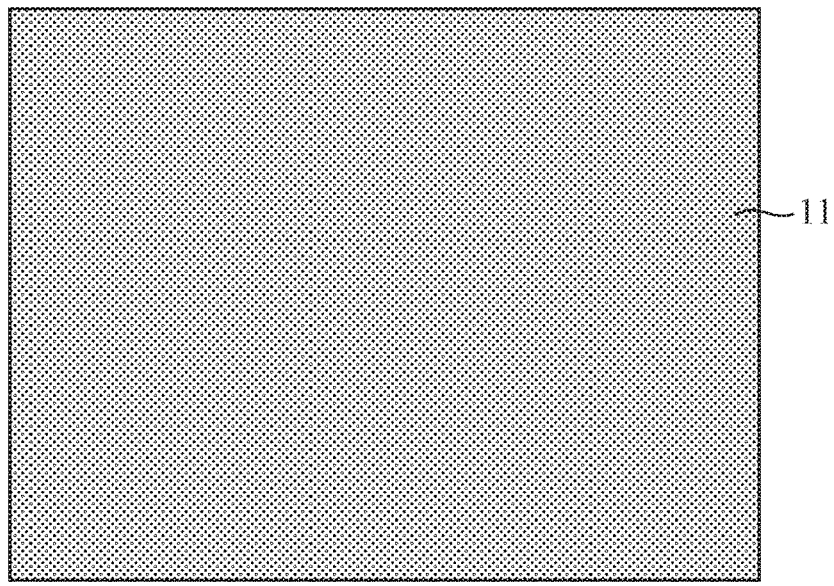
FIG. 3C is a cross-sectional view on arrow showing the module taken on the plane of the B-B' line of FIG. 3A, the module including the inter-board connection structure according to Embodiment 2.

FIG. 3A is a cross-sectional view showing the configuration of a module 1A including an inter-board connection structure according to Embodiment 2 of the present disclosure, and shows the module 1A taken along the C-C' line of FIG. 3B. FIG. 3B is a cross-sectional view on arrow of the module 1A taken on the plane of the A-A' line of FIG. 3A. The A-A' line divides each of the following components:

ground pads 14, a signal pad 21, a signal line conductor 22, a signal line conductor 23, and a signal line conductor 24A into two parts in a thickness direction. FIG. 3C is a cross-sectional view on arrow of the module 1A taken on the plane of the B-B' line of FIG. 3A. The B-B' line divides a plate-shaped ground conductor 11 into two parts in the thickness direction.

In FIGS. 3A, 3B, and 3C, the same components as those shown in FIGS. 1A, 1B, and 1C are denoted by the same reference signs, and an explanation of the components will be omitted hereafter.

The module 1A includes a printed circuit board 100A and a semiconductor board 600, and electrode pads between the printed circuit board 100A and the semiconductor board 600 are electrically connected by the inter-board connection structure according to Embodiment 2.

The printed circuit board 100A is a first dielectric board in which one or more plate-shaped ground conductors 11 are provided in an inner layer. Each plate-shaped ground conductor 11 is a solid ground provided throughout in a corresponding plane of the inner layer of the printed circuit board 100A, as shown in FIG. 3C, and no punched hole is provided in each plate-shaped ground conductor.

For example, in FIG. 3A, two plate-shaped ground conductor layers 11 are provided in the inner layer of the printed circuit board 100A. The two plate-shaped ground conductor layers 11 are electrically connected by multiple ground through holes 12 that are columnar conductors, and are held at the same electric potential. By providing the multiple plate-shaped ground conductors 11, the ground pads 14 can be grounded more surely.

On a front surface of the printed circuit board 100A, the ground pads 14, the signal pad 21, the signal line conductor 22, the signal line conductor 23, and the signal line conductor 24A are provided.

The signal line conductor 24A is a second signal line conductor including a part extending from the signal line conductor 22 shown in FIG. 3B, a signal line conductor 27 provided in the inner layer of the printed circuit board 100A shown in FIG. 3A, and a signal line through hole 26 shown in FIG. 3A. For example, in the signal line conductor 24A, the part extending in a direction from the signal line conductor 22 to the signal pad 21 is electrically connected to the signal line conductor 27 via the signal line through hole 26.

The signal line conductor 27 extends up to an area including a point directly under the signal pad 21 in such a way as to be opposite to the signal pad 21 with respect to a direction of the thickness of the printed circuit board 100A, and a capacitive component is formed between the signal pad 21 and the signal line conductor 27. This portion is referred to as an inter-signal capacitance forming portion 25A.

A leading end of the signal line conductor 27 can have a shape such as a circular or rectangular shape.

In the inter-board connection structure according to Embodiment 2, even though the signal line conductor 23 is designed so as to have a small size in order to downsize an impedance matching circuit, capacitance needed for matching of impedance is ensured by the capacitive component formed in the inter-signal capacitance forming portion 25A.

In the inter-board connection structure according to Embodiment 2, because a pad surface of the signal pad 21 and a wiring surface of the signal line conductor 27 (a surface in a width direction of the signal line conductor 27) are opposite to each other, a higher capacitance value than that in a configuration in which, as Embodiment 1, the signal pad 21 and the signal line conductor 24 are brought close to each other is provided.

As a result, capacitance needed for matching of impedance can be ensured even though the size of the signal line conductor 23 is made smaller than that in the configuration shown in Embodiment 1.

While in a typical printed circuit board the spacing of a conductor pattern is of the order of 100 μm to 200 μm, in the inter-board connection structure according to Embodiment 1 the spacing G that makes it possible to provide capacitance needed for matching of impedance is of the order of several tens of μm.

In contrast with this, in the inter-board connection structure according to Embodiment 2, an appropriate capacitance value is provided depending on the size and the position of the signal line conductor 27 in the inner layer. For this reason, microfabrication of a conductor pattern of the order of several tens of μm is unnecessary.

As mentioned above, in the inter-board connection structure according to Embodiment 2, the signal line conductor 27 is provided in the inner layer of the printed circuit board 100A, and is opposite to the signal pad 21 with respect to the thickness direction of the printed circuit board 100A. By providing this configuration, fine wiring on the outer layer of the printed circuit board 100A is unnecessary, in addition to the advantage shown in Embodiment 1. As a result, a standard printed circuit board can be used, the degree of flexibility of board selection can be increased, and a reduction in the board cost can also be achieved.

Embodiment 3

Figure 4A:
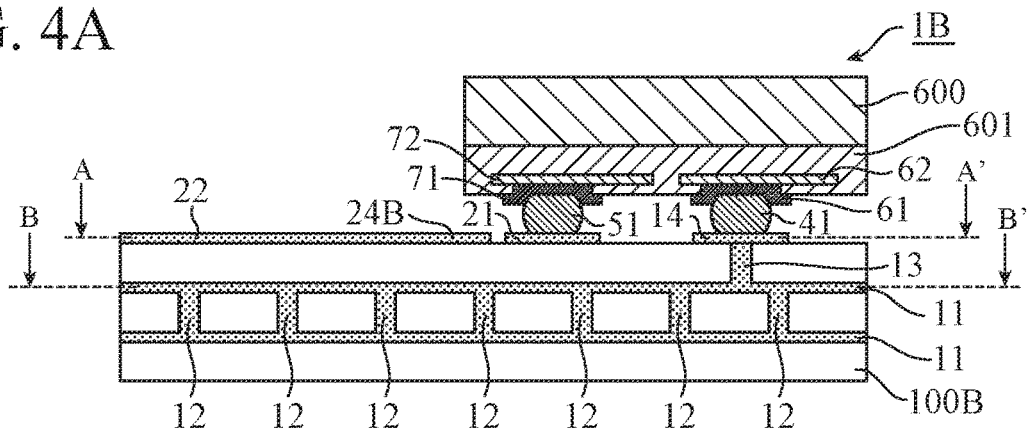
FIG. 4A is a cross-sectional view showing the configuration of a module including an inter-board connection structure according to Embodiment 3 of the present disclosure.
Figure 4B:
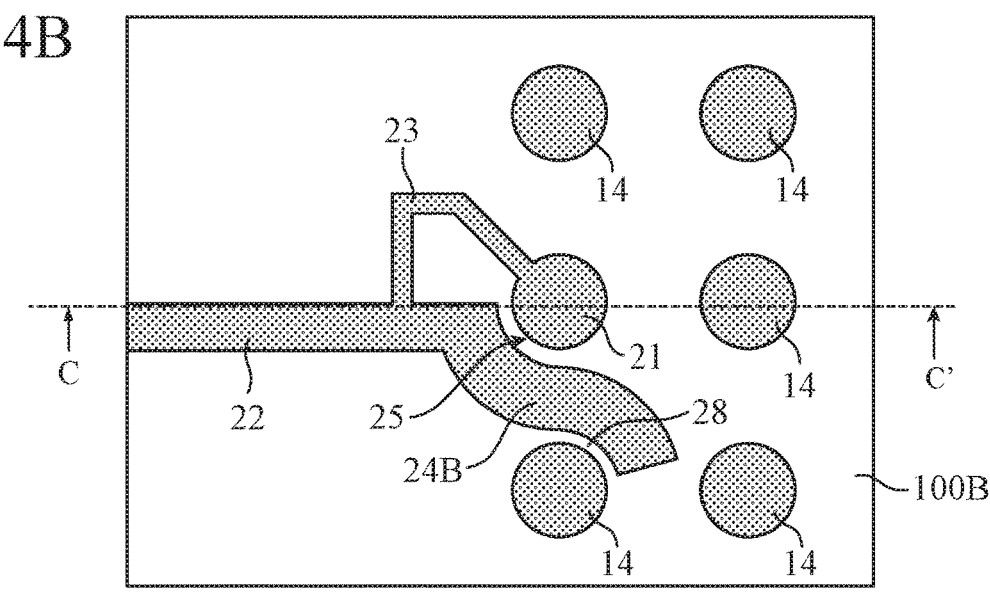
FIG. 4B is a cross-sectional view on arrow showing the module taken on the plane of the A-A' line of FIG. 4A, the module including the inter-board connection structure according to Embodiment 3.
Figure 4C:
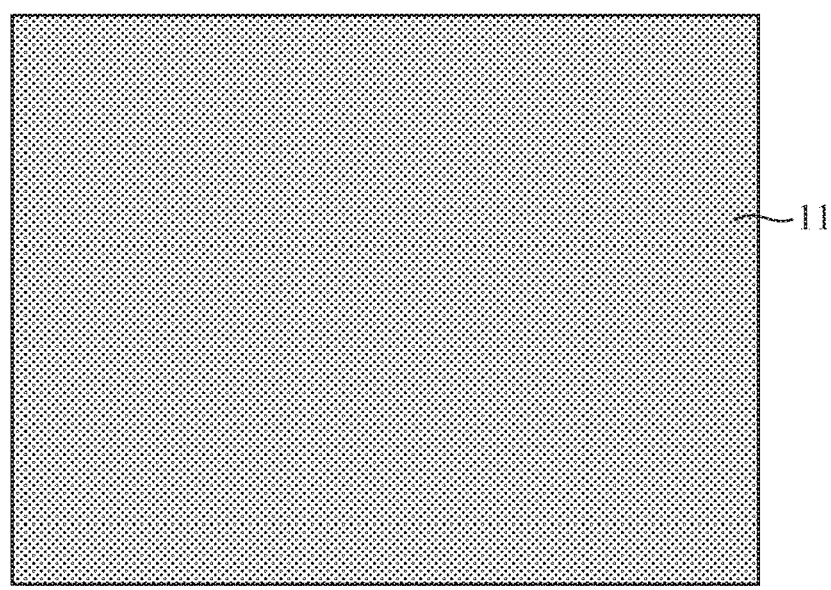
FIG. 4C is a cross-sectional view on arrow showing the module taken on the plane of the B-B' line of FIG. 4A, the module including the inter-board connection structure according to Embodiment 3.

FIG. 4A is a cross-sectional view showing the configuration of a module 1B including an inter-board connection structure according to Embodiment 3 of the present disclosure, and shows the module 1B taken along the C-C' line of FIG. 4B. FIG. 4B is a cross-sectional view on arrow of the module 1B taken on the plane of the A-A' line of FIG. 4A. The A-A' line divides each of the following components: ground pads 14, a signal pad 21, a signal line conductor 22, a signal line conductor 23, and a signal line conductor 24B into two parts in a thickness direction. FIG. 4C is a cross-sectional view on arrow of the module 1B taken on the plane of the B-B' line of FIG. 4A. The B-B' line divides a plate-shaped ground conductor 11 into two parts in the thickness direction.

The module 1B includes a printed circuit board 100B and a semiconductor board 600, and electrode pads between the printed circuit board 100B and the semiconductor board 600 are electrically connected by the inter-board connection structure according to Embodiment 3.

The printed circuit board 100B is a first dielectric board in which one or more plate-shaped ground conductors 11 are provided in an inner layer. Each plate-shaped ground conductor 11 is a solid ground provided throughout in a corresponding plane of the inner layer of the printed circuit board 100B, as shown in FIG. 4C, and no punched hole is provided in each plate-shaped ground conductor.

For example, in FIG. 4A, two plate-shaped ground conductor layers 11 are provided in the inner layer of the printed circuit board 100B. The two plate-shaped ground conductor layers 11 are electrically connected by multiple ground through holes 12 that are columnar conductors, and are held at the same electric potential. By providing the multiple plate-shaped ground conductors 11, the ground pads 14 can be grounded more surely.

On a front surface of the printed circuit board 100B, the ground pads 14, the signal pad 21, the signal line conductor 22, the signal line conductor 23, and the signal line conductor 24B are provided.

The signal line conductor 24B is a second signal line conductor that extends from the signal line conductor 22 along the periphery of the signal pad 21, and further extends along the periphery of a ground pad 14, as shown in FIG. 4B.

In the inter-board connection structure according to Embodiment 3, a capacitive component is formed between the signal pad 21 and the signal line conductor 24B, like in the case of Embodiment 1, and a capacitive component is further formed between the ground pad 14 and the signal line conductor 24B. This portion between the ground pad 14 and the signal line conductor 24B is referred to as a signal-to-ground capacitance forming portion 28.

Further, because the signal line conductor 24B extends along the periphery of the signal pad 21 and, after that, further extends along the periphery of the ground pad 14, the wire length of the signal line conductor 24B is longer than that of the signal line conductor 24 shown in Embodiment 1. As a result, a ground capacitance component formed between the signal line conductor 24B and the plate-shaped ground conductor 11 also increases.

In the inter-board connection structure according to Embodiment 3, capacitance needed for matching of impedance is ensured by the capacitive component formed in the inter-signal capacitance forming portion 25, the capacitive component formed in the signal-to-ground capacitance forming portion 28, and the ground capacitance component in the signal line conductor 24B.

As a result, the inter-board connection structure according to Embodiment 3 can provide a higher capacitance value than that in the configuration in which, as Embodiment 1, the signal pad 21 and the signal line conductor 24 are brought close to each other, and thus ensure capacitance needed for matching of impedance even though the size of the signal line conductor 23 is made smaller than that in the configuration shown in Embodiment 1.

The signal line conductor 24B does not cause an increase in the area of an impedance matching circuit because the wire length of the signal line conductor 24B is lengthened without changing the arrangement of the ground pads 14 and the signal pad 21, as shown in FIG. 4B.

As mentioned above, in the inter-board connection structure according to Embodiment 3, the signal line conductor 24B extends along the periphery of the signal pad 21 and forms a capacitive component between the signal line conductor 24B and the signal pad 21, and further extends along the periphery of a ground pad 14 and forms a capacitive component between the signal line conductor 24B and the ground pad 14.

By configuring in this way, the ground capacitance component needed for matching of impedance can be increased without causing an increase in the area of the impedance matching circuit.

Embodiment 4

Figure 5A:
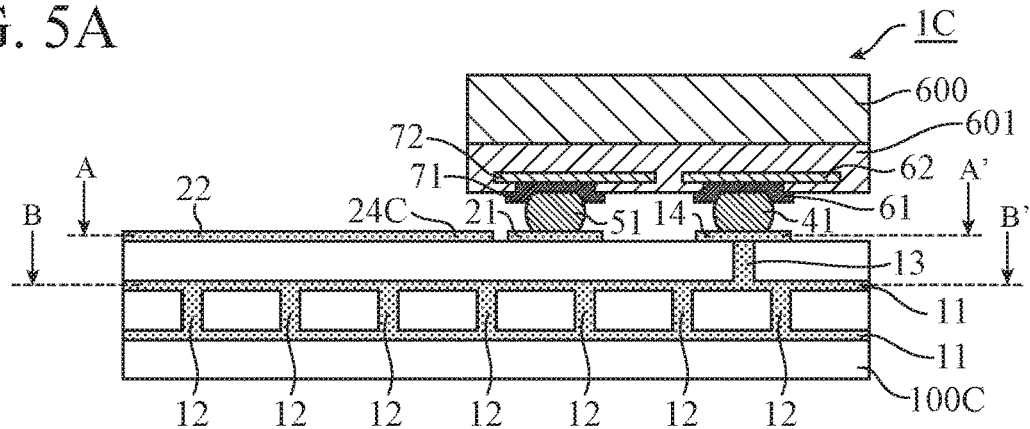
FIG. 5A is a cross-sectional view showing the configuration of a module including an inter-board connection structure according to Embodiment 4 of the present disclosure.
Figure 5B:
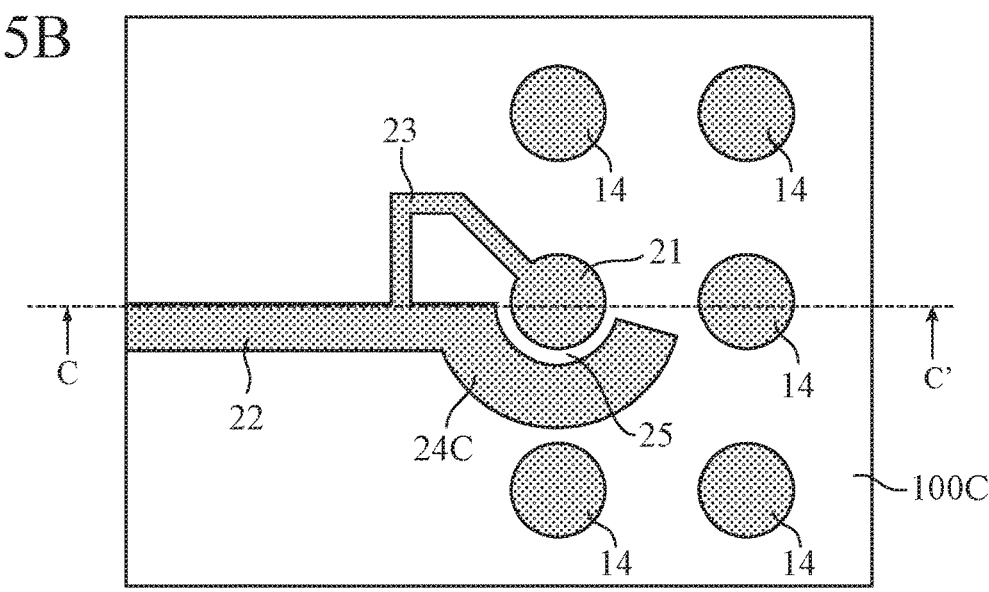
FIG. 5B is a cross-sectional view on arrow showing the module taken on the plane of the A-A' line of FIG. 5A, the module including the inter-board connection structure according to Embodiment 4.
Figure 5C:
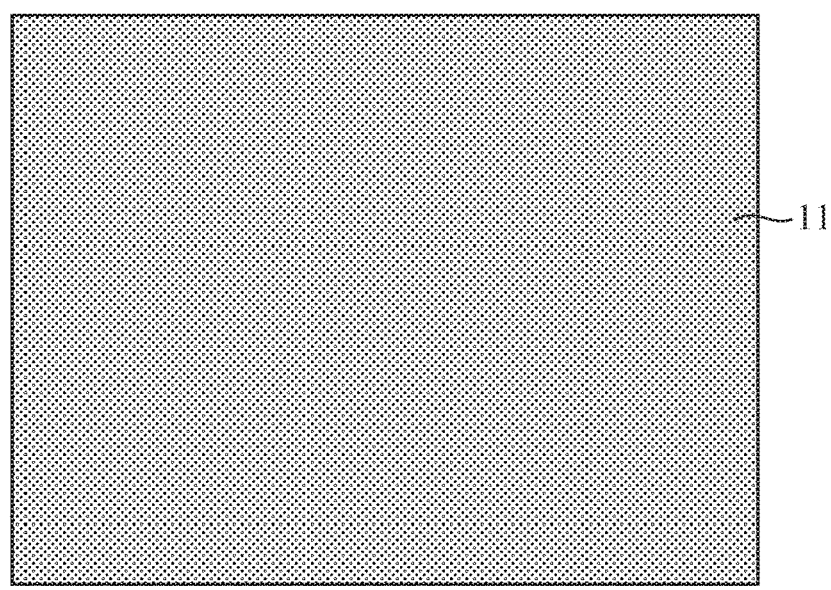
FIG. 5C is a cross-sectional view on arrow showing the module taken on the plane of the B-B' line of FIG. 5A, the module including the inter-board connection structure according to Embodiment 4.

FIG. 5A is a cross-sectional view showing the configuration of a module 1C including an inter-board connection structure according to Embodiment 4 of the present disclosure, and shows the module 1C taken along the C-C' line of FIG. 5B. FIG. 5B is a cross-sectional view on arrow of the module 1C taken on the plane of the A-A' line of FIG. 5A. The A-A' line divides each of the following components: ground pads 14, a signal pad 21, a signal line conductor 22, a signal line conductor 23, and a signal line conductor 24C into two parts in a thickness direction. FIG. 5C is a cross-sectional view on arrow of the module 1C taken on the plane of the B-B' line of FIG. 5A. The B-B' line divides a plate-shaped ground conductor 11 into two parts in the thickness direction.

The module 1C includes a printed circuit board 100C and a semiconductor board 600, and electrode pads between the printed circuit board 100C and the semiconductor board 600 are electrically connected by the inter-board connection structure according to Embodiment 4.

The printed circuit board 100C is a first dielectric board in which one or more plate-shaped ground conductors 11 are provided in an inner layer. Each plate-shaped ground conductor 11 is a solid ground provided throughout in a corresponding plane of the inner layer of the printed circuit board 100C, as shown in FIG. 5C, and no punched hole is provided in each plate-shaped ground conductor.

For example, in FIG. 5A, two plate-shaped ground conductor layers 11 are provided in the inner layer of the printed circuit board 100C. The two plate-shaped ground conductor layers 11 are electrically connected by multiple ground through holes 12 that are columnar conductors, and are held at the same electric potential. By providing the multiple plate-shaped ground conductors 11, the ground pads 14 can be grounded more surely.

On a front surface of the printed circuit board 100C, the ground pads 14, the signal pad 21, the signal line conductor 22, the signal line conductor 23, and the signal line conductor 24C are provided.

The signal line conductor 24C is a second signal line conductor that extends, between the signal pad 21 and an adjacent ground pad 14 thereto, along and around the periphery of the signal pad 21, as shown in FIG. 5B.

Because the signal line conductor 24C extends along and around the periphery of the signal pad 21, a portion where the signal pad 21 and the signal line conductor 24C are close to each other, i.e., an inter-signal capacitance forming portion 25 is long. As a result, a capacitive component formed in the inter-signal capacitance forming portion 25 is increased in comparison with that in the configuration shown in FIG. 1B.

In addition, the wire length of the signal line conductor 24C is longer than that of the signal line conductor 24 shown in Embodiment 1, by the length of the part extending along and around the periphery of the signal pad 21. As a result, a ground capacitance component formed between the signal line conductor 24C and the plate-shaped ground conductor 11 also increases.

Therefore, in the inter-board connection structure according to Embodiment 4, even though the signal line conductor 23 is designed so as to have a small size, capacitance needed for matching of impedance is ensured by both the capacitive component formed in the inter-signal capacitance forming portion 25 and the ground capacitance component in the signal line conductor 24C.

As a result, the inter-board connection structure according to Embodiment 4 can provide a higher capacitance value than that in the configuration in which, as Embodiment 1, the signal pad 21 and the signal line conductor 24 are brought close to each other, and thus ensure capacitance needed for matching of impedance even though the size of the signal line conductor 23 is made smaller than that in the configuration shown in Embodiment 1.

Although in FIG. 5B the signal line conductor 24C formed to extend approximately halfway around the periphery of the signal pad 21 is shown, the signal line conductor 24C may be formed to extend more than halfway around the periphery of the signal pad.

Further, because the wire length of the signal line conductor 24C is lengthened without changing the arrangement of the ground pads 14 and the signal pad 21, as shown in FIG. 5B, an increase in the area of an impedance matching circuit is not caused.

As mentioned above, in the inter-board connection structure according to Embodiment 4, the signal line conductor 24C extends, between the signal pad 21 and an adjacent ground pad 14 thereto, along and around the periphery of the signal pad 21. By configuring in this way, the ground capacitance component needed for matching of impedance can be increased without causing an increase in the area of the impedance matching circuit.

It is to be understood that any combination of two or more of the above-mentioned embodiments can be made, various changes can be made in any component in each of the above-mentioned embodiments, or any component in each of the above-mentioned embodiments can be omitted within the scope of the present disclosure.

INDUSTRIAL APPLICABILITY

Because the inter-board connection structure according to the present disclosure can downsize an impedance matching circuit, the inter-board connection structure is suitable for various types of high frequency transmission circuits.

REFERENCE SIGNS LIST

1, 1A to 1C module, 11 plate-shaped ground conductor, 12, 13 ground through hole, 14, 61 ground pad, 21, 71 signal pad, 22 to 24, 24A to 24C, 27, 72, 240 signal line conductor, 25, 25A inter-signal capacitance forming portion, 26 signal line through hole, 28 inter-ground capacitance forming portion, 41 ground bump, 51 signal bump, 62 ground conductor, 100, 100A to 100C, 1000 printed circuit board, 600 semiconductor board, and 601 wiring layer.

The invention claimed is:

1. An inter-board connection structure comprising:
a plate-shaped ground conductor provided in an inner layer of a first dielectric board;
a first signal pad provided in an outer layer of the first dielectric board;
a first ground pad provided in the outer layer of the first dielectric board and in an area surrounding the first signal pad;
a columnar conductor electrically connecting the plate-shaped ground conductor and the first ground pad;
a first signal line conductor provided in the outer layer or the inner layer of the first dielectric board;
a second signal line conductor extending in a direction from the first signal line conductor to the first signal pad, and forming a capacitive component between the second signal line conductor and the first signal pad;
a third signal line conductor branching and extending from a connecting portion between the first signal line conductor and the second signal line conductor, and electrically connected to the first signal pad;
a second signal pad provided in an outer layer of a second dielectric board;
a second ground pad provided in the outer layer of the second dielectric board and in an area surrounding the second signal pad;
a signal bump electrically connecting the first signal pad and the second signal pad; and
a ground bump electrically connecting the first ground pad and the second ground pad.

2. The inter-board connection structure according to claim 1, wherein the second signal line conductor extends along a periphery of the first signal pad, and a side surface in a thickness direction of the second signal line conductor is opposite to a side surface in a thickness direction of the first signal pad between the second signal line conductor and the first signal pad.

3. The inter-board connection structure according to claim 2, wherein the second signal line conductor further extends along a periphery of the first ground pad, and forms a capacitive component between the second signal line conductor and the first ground pad.

4. The inter-board connection structure according to claim 2, wherein the second signal line conductor extends, between the first signal pad and the first ground pad adjacent to the first signal pad, along and around the periphery of the first signal pad.

5. The inter-board connection structure according to claim 1, wherein the second signal line conductor is provided in the inner layer of the first dielectric board, and is opposite to the first signal pad with respect to a thickness direction of the first dielectric board.

* * * * *